(12) United States Patent
Paille

(10) Patent No.: US 8,165,259 B2
(45) Date of Patent: Apr. 24, 2012

(54) METHOD AND DEVICE FOR PROCESSING THE FREQUENCY SHIFT OF THE CARRIER FREQUENCY OF A SIGNAL MODULATED WITH A QUADRATURE CONTINUOUS SINGLE-CARRIER MODULATION

(75) Inventor: Bruno Paille, Saint Aupre (FR)

(73) Assignee: STMicroelectronics, S.A., Montrouge (FR)

( * ) Notice: Subject to any disclaimer, the term of this patent is extended or adjusted under 35 U.S.C. 154(b) by 576 days.

(21) Appl. No.: 12/360,543

(22) Filed: Jan. 27, 2009

(65) Prior Publication Data
US 2009/0135979 A1 May 28, 2009

Related U.S. Application Data

(62) Division of application No. 10/929,099, filed on Aug. 26, 2004, now Pat. No. 7,505,543.

(30) Foreign Application Priority Data

Sep. 2, 2003 (FR) ..................................... 03 10388

(51) Int. Cl.
*H03D 3/24* (2006.01)
(52) U.S. Cl. ...................................................... 375/376
(58) Field of Classification Search .................. 375/376, 375/354, 373, 375, 261, 268, 215, 294, 327; 342/103; 370/503; 455/180.3, 266
See application file for complete search history.

(56) References Cited

U.S. PATENT DOCUMENTS

| 4,916,405 | A |   | 4/1990  | Keate et al.            |
|-----------|-----|---|---------|-------------------------|
| 5,128,625 | A |   | 7/1992  | Yatsuzuka et al.        |
| 5,440,268 | A | * | 8/1995  | Taga et al. ..... 329/308 |
| 5,815,535 | A |   | 9/1998  | Choi et al.             |
| 5,872,812 | A |   | 2/1999  | Saito et al.            |
| 6,282,414 | B1| * | 8/2001  | Tsukuda ........ 455/326 |
| 6,300,808 | B1|   | 10/2001 | Kuehn                   |
| 7,010,280 | B1| * | 3/2006  | Wilson ......... 455/126 |
| 7,421,043 | B2| * | 9/2008  | Raby ............ 375/327 |
| 2002/0067778 | A1 |  | 6/2002 | Ahn                   |

FOREIGN PATENT DOCUMENTS

EP 0 805 560 A2 11/1997

OTHER PUBLICATIONS

Nam-Guk, Kim, et al., "Design of ADPLL for Both Large Lock-In Range and Good Tracking Performance", IEEE Transactions on Circuits and Systems II, Analog and Digital Signal Processing, vol. 46, No. 9, Sep. 1999, pp. 1192-1204, XP000920472, ISSN: 1057-7130.

(Continued)

Primary Examiner — Sam K Ahn
(74) Attorney, Agent, or Firm — Gardere Wynne Sewell LLP

(57) ABSTRACT

A frequency shift of a carrier frequency of an input signal is estimated with a frequency estimator in order to obtain an estimate value. Then, the estimate of the frequency shift is refined, and the carrier frequency is corrected in consequence, with a phase-locked loop that is initialized with the estimate value. The phase-locked loop has a locking frequency range that is narrower than a locking frequency range of the frequency estimator.

22 Claims, 5 Drawing Sheets

OTHER PUBLICATIONS

Fiocchi, C. et al, "A Sigma-Delta Based PLL for Non-Sinusoidal Waveforms", Proceedings of the International Symposium on Circuits and Systems, San Diego, CA, May 10-13, 1992, Proceedings of the International Symposium on Circuits and Systems (ISCAS) vol. 4, CONF. 25, May 3, 2002, pp. 2662-2664, XP010061743, IEEE, New York, US, ISBN: 0-7803-0593-0.

Preliminary European Search Report, EP 04 29 2080, dated Oct. 26, 2004.

H. Sari, et al., "New Phase and Frequency Detectors for Carrier Recovery in PSK and QAM Systems", IEEE Transactions on Communications, vol. 36, No. 9, Sep. 9, 1988, pp. 1035-1043, XP000758621.

Preliminary French Search Report, FR 03 10388, dated Jun. 16, 2004.

* cited by examiner

_METHOD AND DEVICE FOR PROCESSING THE FREQUENCY SHIFT OF THE CARRIER FREQUENCY OF A SIGNAL MODULATED WITH A QUADRATURE CONTINUOUS SINGLE-CARRIER MODULATION_

PRIORITY CLAIM

The present application is a divisional application of U.S. application Ser. No. 10/929,099 filed Aug. 26, 2004, now U.S. Pat. No. 7,505,543 which application claims priority from French Application for Patent No. 03 10388 filed Sep. 2, 2003, the disclosures of which are hereby incorporated by reference.

BACKGROUND

1. Technical Field

The present invention relates to the decoding of radio transmission channels carrying coded digital information. More precisely, the invention relates to the acquisition of the carrier frequency of a signal modulated with a quadrature single-carrier continuous modulation, for example, a quadrature amplitude modulation known as QAM.

2. Description of Related Art

Solutions currently used to carry out the acquisition and monitoring of the carrier frequency are based on phase-locked loops.

More precisely, a first category of solution uses a phase-locked loop having a wide frequency locking range for the acquisition of the carrier frequency, then a narrower frequency locking range when monitoring the carrier frequency. However, such a solution has a disadvantage in that the acquisition may fail with an input signal of poor quality.

A second category of solution uses a phase-locked loop having a narrow frequency locking range in order to be able to carry out the acquisition of a poor quality signal and in parallel uses a frequency scanning algorithm in order to acquire a signal exhibiting a significant frequency shift from the carrier frequency. However, this second solution has a disadvantage of requiring considerable locking time.

A need accordingly exists in the art to address the foregoing disadvantages.

More specifically, a need exists to be able to estimate and correct significant frequency shifts, for example of the order of hundreds of kHz even with a poor quality input signal, for example exhibiting a signal-to-noise ratio of the order of 20 dB for a 64 QAM modulation, and doing so for a short time, for example of the order of a hundred milliseconds.

SUMMARY

In accordance with one embodiment, a method of processing the frequency shift of the carrier frequency of a signal modulated with a quadrature continuous single-carrier modulation comprises making a first estimate of the shift with a frequency estimator in order to obtain a first estimate value. Then, the estimate of the frequency shift is refined and the carrier frequency is corrected in consequence, with a phase-locked loop initialized with the first estimate value and with the locking frequency range being narrower than the locking frequency range of the frequency estimator.

In other words, according to an embodiment, the acquisition and monitoring of the carrier frequency is based on the use of a frequency estimator in combination with a phase-locked loop. At the time of acquisition, the frequency estimator makes an estimate of the frequency shift in an imprecise manner while the phase-locked loop is deactivated. Then, when the result of this first estimate has been obtained, it is used to initialize the phase-locked loop exhibiting a narrow frequency locking range.

Thus, the phase-locked loop will refine the result of the estimate delivered by the frequency estimator and supply an estimate with greater accuracy.

According to one mode of implementation, the oscillator of the phase-locked loop is controlled by the output of the loop filter augmented by the first estimate value.

The signal received by the frequency estimator comprises samples belonging to a constellation of dots. This constellation may be square (as is the case for example with 16 QAM, 64 QAM, 256 QAM or 1024 QAM modulations) or not square (as is the case for example with 32 QAM, 128 QAM or 512 QAM modulations). For the so-called square constellations, and, according to one embodiment, used to make the frequency estimate in a relatively simple and rapid manner even with a modulation of the QAM type exhibiting a large number of states, the first estimate is made using only received samples situated in the corner zones of the square.

The so-called non-square constellations nevertheless possess a square internal zone of dots. For these so-called non-square constellations, and, according to one mode of implementation, used to make the frequency estimate in a relatively simple and rapid manner even with a modulation of the QAM type exhibiting a large number of states, the first estimate is made using only received samples situated in the corner zones of the internal square.

Advantageously the first estimate is made on a predetermined number of samples of the signal received by the frequency estimator, for example on some 100,000 samples.

According to one mode of implementation, after activation of the phase-locked loop, the estimate of the frequency shift is continued with the frequency estimator, and this new estimate is used to track the evolution of the value of the carrier frequency.

This, for example, is to verify that the new values estimated for the frequency shift do not vary too much. More precisely, the variance of these estimates can be compared with a predetermined threshold.

An embodiment also proposes a device for processing the frequency shift of the carrier frequency of an incident signal modulated with a quadrature continuous single-carrier modulation.

According to one general feature, the device comprises a signal input, a frequency estimator connected to the input suitable for delivering a first estimate value of the frequency shift, a phase-locked loop connected to the input and whose locking frequency range is narrower than the locking frequency range of the frequency estimator, control means suitable for activating the phase-locked loop only on delivery of the first estimate value, and initialization means suitable for initializing the phase-locked loop with the first estimate value.

According to one embodiment, the initialization means comprise a memory means, such as a register, suitable for storing the first estimate value and an adder possessing a first input connected to the output of the loop filter, a second input connected to the memory means and an output connected to the control input of the loop oscillator.

The signal received by the frequency estimator comprises samples belonging to a constellation of dots, some of which belong to a square (this square is external for square modulations and internal for non-square modulations). And, according to one embodiment, the frequency estimator makes the first estimate using only received samples situated in the corner zones of the square.

According to one embodiment, the control means disconnect the frequency estimator from the phase-locked loop after the activation of the phase-locked loop, and the estimator then continues the estimate of the frequency shift. The device also comprises tracking means connected to the output of the estimator and suitable for using any new estimate to track the evolution of the value of the carrier frequency.

The device is advantageously produced in integrated manner.

An embodiment also proposes a receiver of signals modulated with a quadrature continuous single-carrier modulation, comprising a processing device as defined hereabove.

In an embodiment, a phase lock loop circuit comprises: a controlled oscillator outputting an oscillation signal having frequency set as a function of a control signal received at an input of the controlled oscillator; a mixer having first and second inputs and an output, the first input receiving an input signal and the second input receiving the oscillation signal; a phase detector having an input connected to the mixer output and having an output; a loop filter having an input connected to the phase detector output and having an output; an adder having first and second inputs and an output producing the control signal applied to the controlled oscillator input, the first input connected to the loop filter output; and a memory storing an estimate value of a frequency shift of a carrier frequency of the input signal, the estimate value applied to the second input of the adder.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
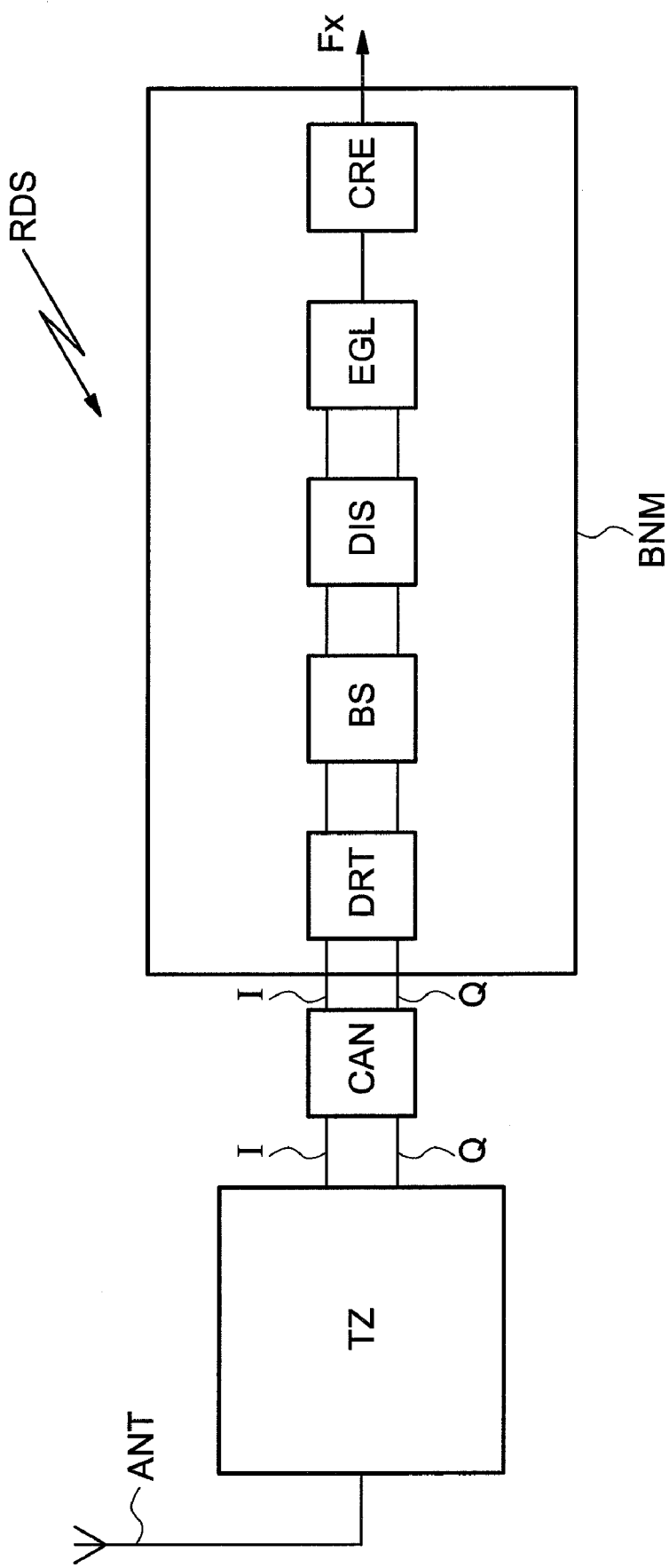
FIG. 1 illustrates schematically a signal receiver incorporating a processing device.

In FIG. 1, the reference RDS denotes a signal receiver. The incident signals received at the antenna ANT of the receiver are signals modulated with a quadrature continuous single-carrier modulation, for example an N-state quadrature amplitude modulation (known as N-QAM).

The receiver RDS comprises at the head a tuner or tuning device linked to the antenna ANT. The tuner TZ is used to transpose the signal received by the antenna into a signal with a predetermined frequency, which may be the zero frequency (the signal is then in baseband) if the tuner exhibits an architecture of the zero intermediate frequency (ZIF) type or a non-zero intermediate frequency, for example 36 or 44 MHz.

The signal that has come from the tuner TZ and has been transposed onto two phase quadrature channels I and Q if the tuner is at zero intermediate frequency or onto a single channel if the signal is centered on a non-zero frequency, is then sampled in an analog/digital conversion CAN stage.

At the output of this analog/digital conversion CAN stage, a processing digital block BNM is connected comprising in particular at the head means of correction DRT (Derotator) suitable for correcting the frequency shifts of the frequency synthesizers.

Upstream of the correction means DRT, the signal is centered on the predetermined frequency (zero in the case of a ZIF architecture, or non-zero) to within one $\Delta f$ frequency shift.

At the output of the correction means DRT, the intermediate frequency is removed to within $\Delta f$ and the signal is then said to be pseudo-baseband and is centered on the $\Delta f$ frequency.

Such correction (derotation) means are conventional and known per se. They may for example be those described in European patent application No. 0,481,543, the disclosure of which is hereby incorporated by reference.

The correction means DRT are followed by a synchronization loop BS, equally conventional and known per se, the function of which is to synchronize the rate of the data received with the rate of the data transmitted.

The synchronization loop BS is followed by a device DIS, used to estimate the frequency shift $\Delta f$ and in consequence correct the carrier frequency of the incident signal received.

The device DIS is followed by an equalizer EGL, of conventional structure, in turn followed by an error correction stage carrying out the conventional error correction processes well known to those skilled in the art, known as FEC (Forward Error Correction). The error correction stage then delivers a flow Fx which will be decoded in a source decoding block in order to restore the transmitted data. It should be noted that the equalizer EGL may be integrated into the phase-locked loop present in the device DIS.

Figure 2:
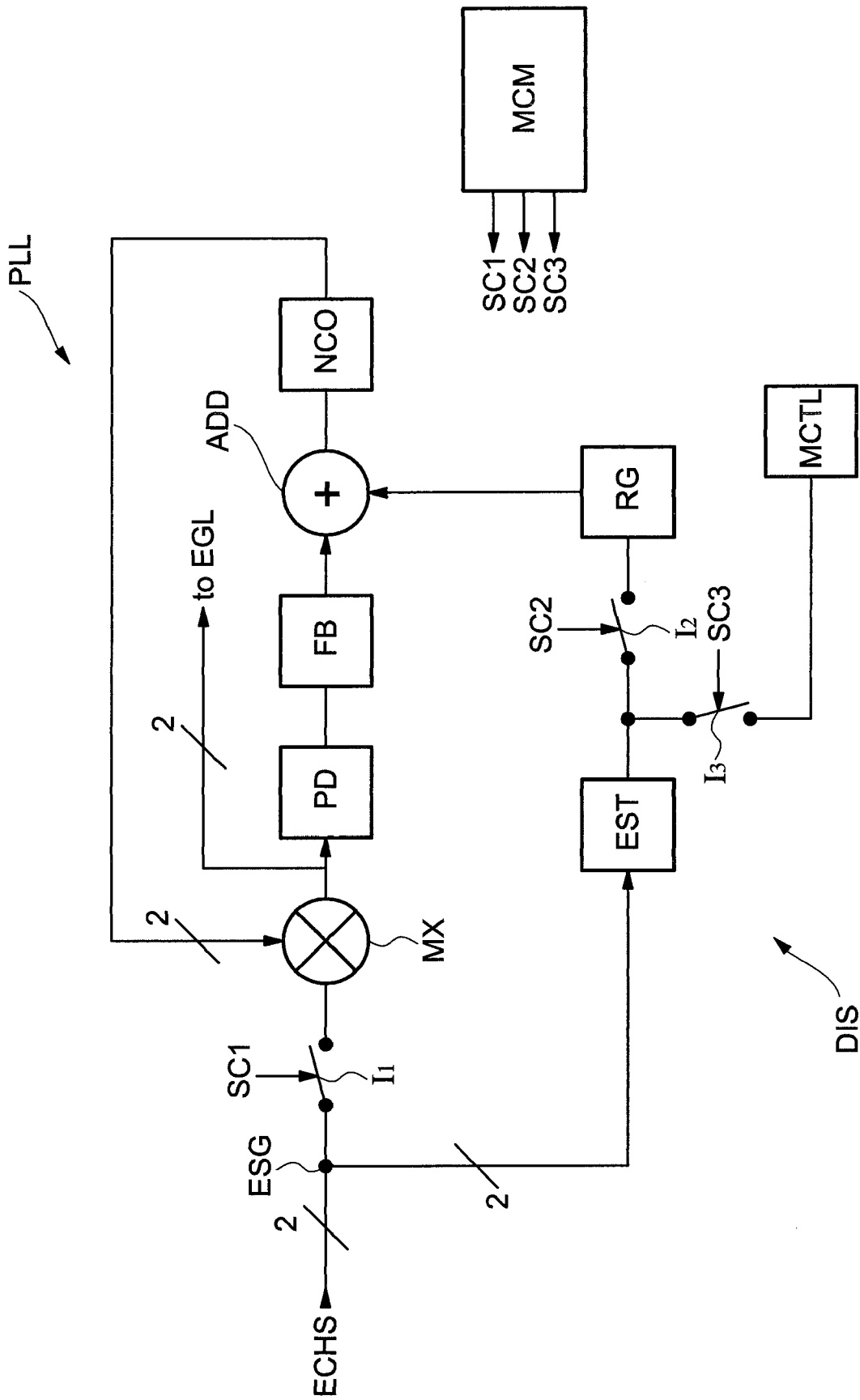
FIG. 2 illustrates in greater detail, but still schematically, one embodiment of a processing device.

FIG. 2 shows that the device DIS comprises a signal input ESG receiving the incident samples ECHS of the two channels I and Q.

A frequency estimation device EST is linked to the ESG signal input.

As will be seen in greater detail hereafter, this frequency estimator EST will deliver a first estimate value of the frequency shift $\Delta f$ which will be stored in a memory means RG such as a register.

In addition to this frequency estimator, the device DIS comprises a phase-locked loop PLL comprising a complex mixer MX linked to the signal input ESG via a switch controlled by a signal SC1.

The phase-locked loop PLL also comprises in conventional manner a phase detector PD followed by a bandpass loop filter FB.

Between this loop filter FB and the controlled loop oscillator, which here is a numerically controlled oscillator NCO, there is an adder ADD with a first input connected to the output of the loop filter and another input connected to the register RG.

The output of the adder ADD is linked to the control input of the oscillator NCO.

The output of the oscillator NCO is looped back to the other input of the mixer MX.

The output of the mixer MX, when the phase loop is locked after having refined the estimate of the frequency shift $\Delta f$, will be a signal on the two channels I and Q, centered on the zero frequency. This signal is delivered to the equalizer EGL.

Furthermore, control means MCM deliver the control signals SC1, SC2 and SC3 controlling respectively the corresponding switches I1, I2, I3.

The operation of the device DIS will now be described in detail also with reference to FIGS. 3, 4 and 5.

During a first phase of reception of the samples ECHS, the loop PLL is deactivated (step 40, FIG. 5), which has been symbolized in FIG. 2 by the switch I1 being open.

Although different structures of estimator may be used, the estimator EST described here as an indication is similar to an estimator used for a 4QAM or QPSK modulation and this is so irrespective of the size of the modulation. It estimates (step 41) the frequency shift Δf by first computing the phases of the different samples retained and then computing the time derivatives of these computed phases (after removal of the modulation). This is done on a predetermined number of samples, for example on around 100 000 samples. The average of the values thus obtained is proportional to the estimate of the frequency shift and is used to supply a first estimate value $\Delta f_b$ of the value of the frequency shift.

One solution for computing the phase of a complex number consists in building into the estimation means a specific algorithm known to those skilled in the art as the CORDIC (Coordinate Rotation Digital Computer) published in the review IRE Trans. Electrons. Compute. EC-8, pages 330-334 (J. Volder-1959), the disclosure of which is hereby incorporated by reference.

This being so, in the presence of a QAM type modulation for example, with a large number of states, 64 for example, the removal of the modulation becomes very complex (the operation of removing the modulation is also routinely called ambiguity resolution).

Also, advantageously the choice will be made to take only "easy" dots to process, that is to say, in this particular instance, dots situated in corner zones of the constellation.

Figure 3:
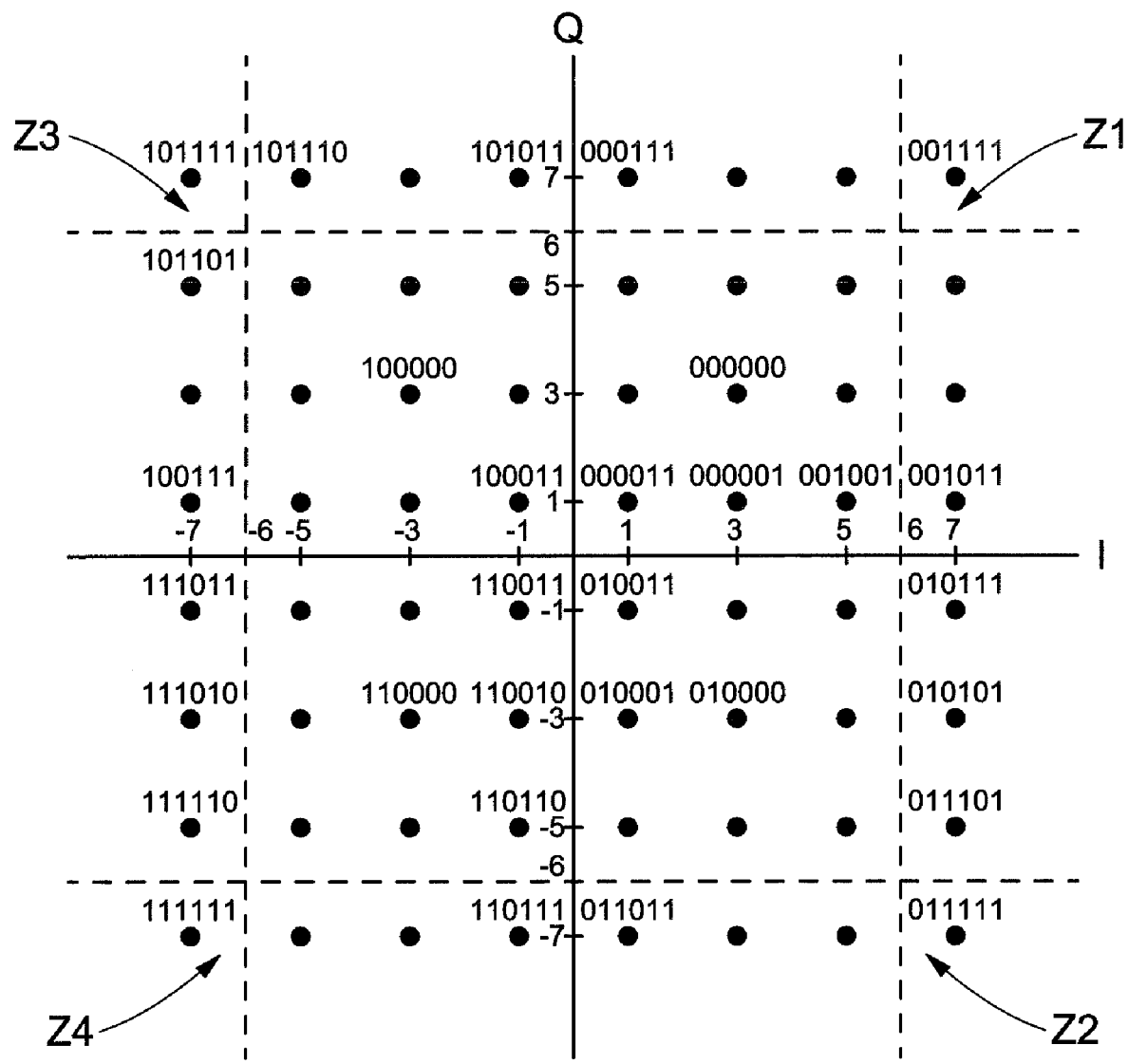
FIG. 3 represents, on an example of square modulation, corner zones used in the estimate of the frequency shift of the carrier frequency.

More precisely, FIG. 3 illustrates the constellation of dots of a square quadrature amplitude modulation with 64 states, that is to say 6 bits per symbol (called 64-QAM modulation). In this constellation of dots, each of the 64 symbols coded on 6 bits corresponds to two three-bit words, I and Q, having a predetermined value.

The constellation dots situated in the corners of the square are those for which I and Q are (in the absence of frequency shift) equal to 7 in absolute value.

In consequence, the corner zones Z1-Z4 will be defined as the zones for which the values I and Q of the samples received are (in the absence of frequency shift) in absolute value higher than a predetermined threshold, in this particular instance 6.

Figure 4:
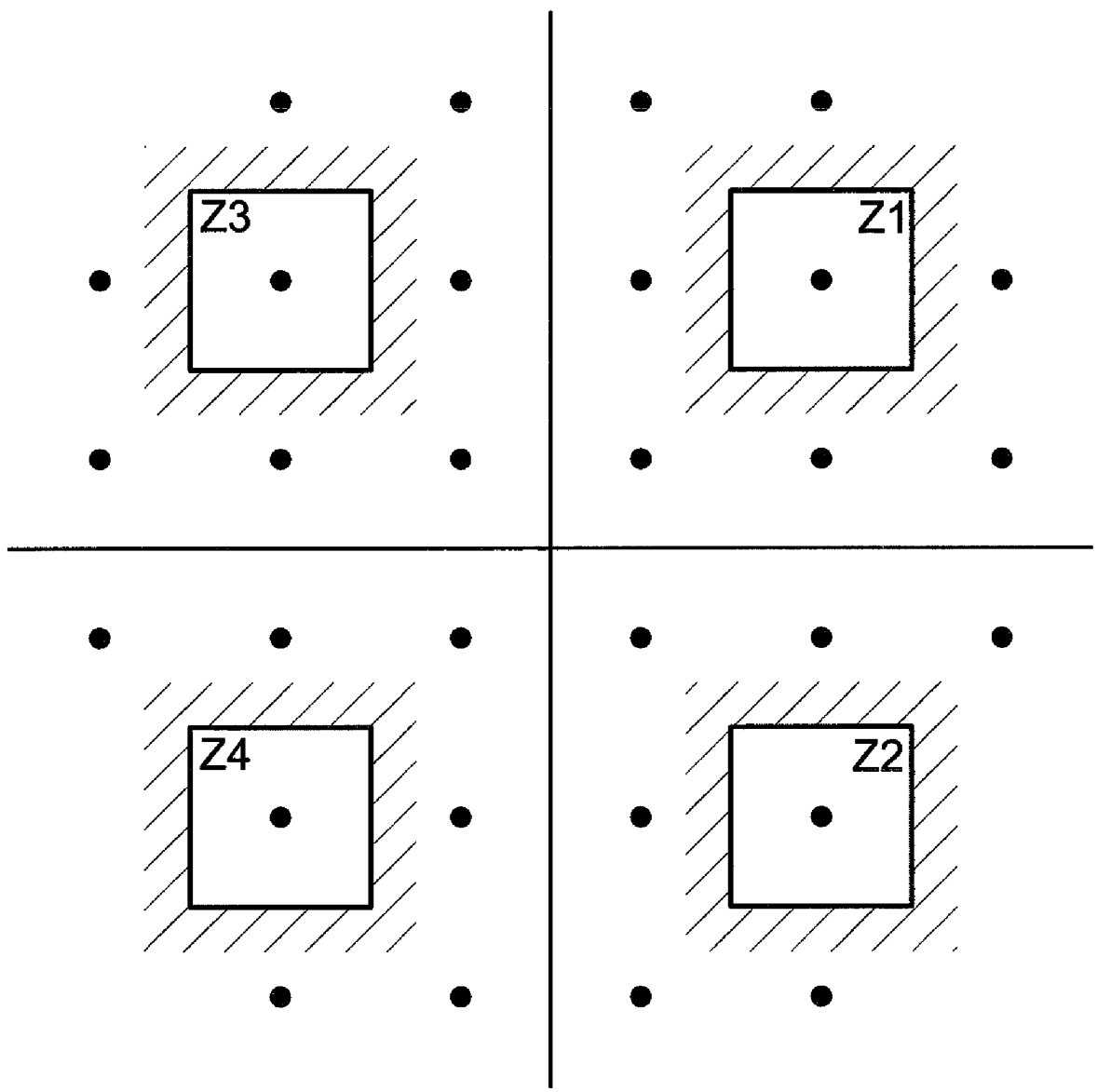
FIG. 4 represents, on an example of non-square modulation, corner zones used in the estimate of the frequency shift of the carrier frequency.

Similarly, FIG. 4 illustrates the constellation of dots of a non-square quadrature amplitude modulation with 32 states, that is to say five bits per symbol (known as "32-QAM modulation"). In this constellation of dots, each of the 32 symbols coded on five bits corresponds to two three-bit words, I and Q, having a predetermined value.

The internal square of the constellation corresponds to the constellation dots for which I and Q are (in the absence of frequency shift) equal to 3 in absolute value.

Consequently, the corner zones Z1-Z4 will be defined as the zones for which the values I and Q of the samples received are (in the absence of frequency shift) in absolute value higher than a first predetermined threshold, in this particular instance 2, and lower than a second predetermined threshold, in this particular instance 4.

Thus, for each sample received, the estimation means EST retain and process only those situated in the corner zones Z1-Z4.

This therefore boils down, to an extent, to the processing of a QPSK type modulation (that is to say a 4-QAM modulation) much less complex to process with regard to removal of the modulation.

On the other hand, the frequency estimate thus obtained loses accuracy but will in any case be refined by the phase-locked loop.

In this respect, the locking frequency range of the estimator, that is to say the frequency range outside which it is not possible to estimate the frequency shift, depends on the speed of data transmission and on the characteristics of the estimation algorithm. Those skilled in the art will be able to adjust the algorithm characteristics in order to obtain a sufficiently large estimator locking loop, for example of the order of a few hundred kHz. One of the characteristics of the algorithm that can be used to adjust the locking frequency range of the estimator is the number of samples not situated in the corner zones that are tolerated between two samples situated in the corner zones.

As an indication, for a number equal to four, a locking frequency range is obtained of the order of a few hundred kHz for modulations having speeds of the order of 5 Mbaud.

Figure 5:
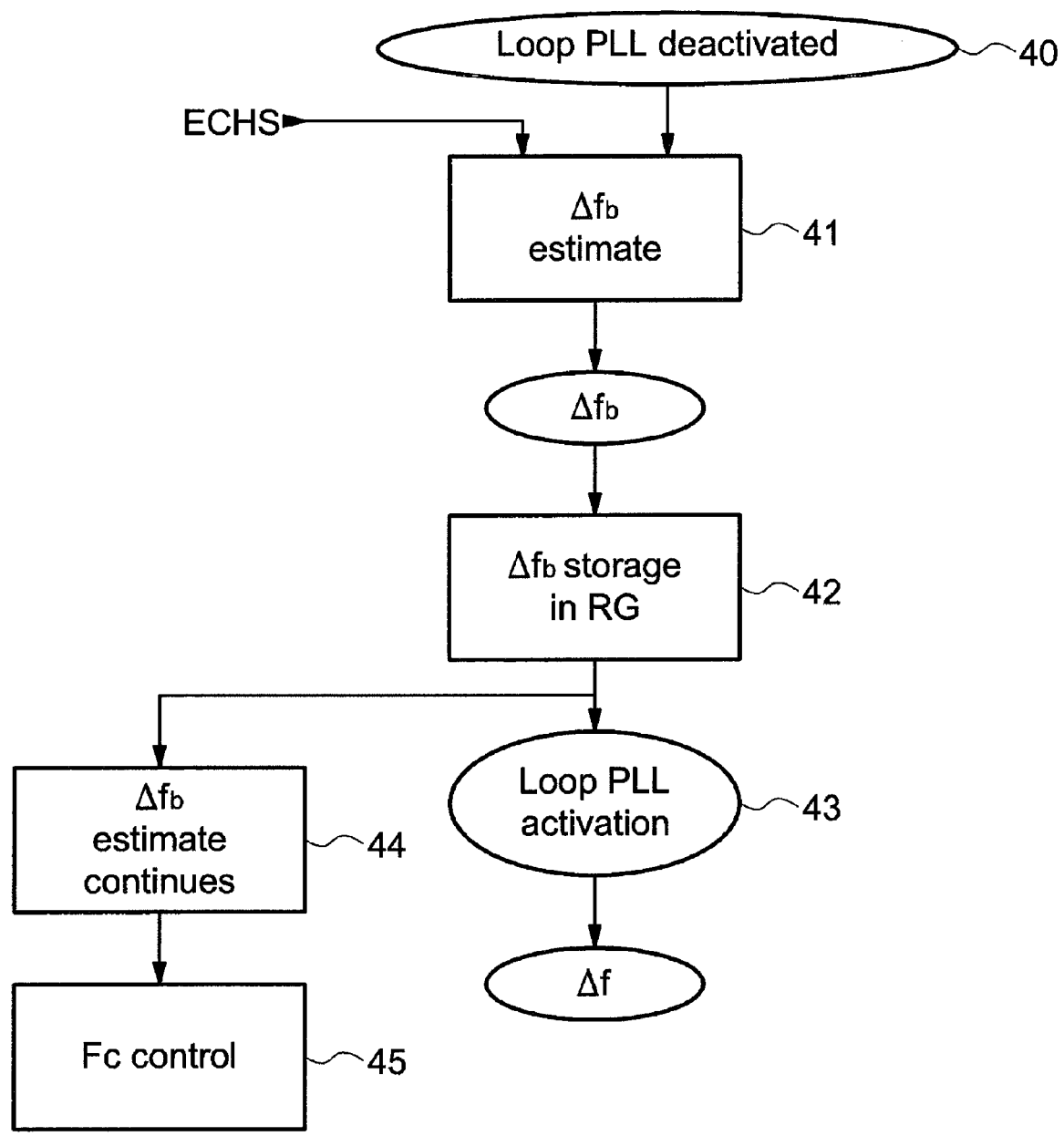
FIG. 5 is a schematic block diagram of a mode of implementation of the method.

After this estimation phase 41 (FIG. 5), the first estimate value $\Delta f_b$ is stored in the register RG (switch I2 closed, step 42, FIG. 5).

The phase-locked loop PLL is then activated (step 43; switch I1 closed; switch I2 open) and switch I3 is opened.

The phase-locked loop PLL is therefore initialized with the value $\Delta f_b$ originating from the register RG and will refine the estimate of frequency shift until it delivers at the output of the mixer MX a signal centered on the zero frequency. The locking frequency range of the phase shift loop is narrow. More precisely, it is chosen to be narrower, even much narrower than the frequency locking range of the frequency estimator EST, but greater than the maximum estimation error at the output of the estimator EST. As an indication, the characteristics of the loop filter FB will be chosen in particular in order to have a locking frequency range of a few kHz for the loop PLL.

On activation of the loop PLL (step 43), the estimation means EST advantageously continue the estimation of the frequency shift (step 44). These estimate values are then transmitted to tracking means MCTL (switch I3 closed), in order to track the evolution of the carrier frequency Fc (step 45). In this respect, the tracking means will verify that the different estimated values of the frequency shift do not vary too much. More precisely, a way of verifying these consists in computing the variance of the estimated values and comparing this variance with a predetermined threshold. According to one mode of implementation, if this variance is greater than the predetermined threshold, the system may be reinitialized (return to step 40).

Although preferred embodiments of the method and apparatus have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A phase lock loop circuit, comprising:
    a mixer having first and second inputs and an output, the first input configured to receive an input signal;
    a phase detector having an input connected to the mixer output and having an output;
    a loop filter having an input connected to the phase detector output and having an output;
    an adder having first and second inputs and an output, the first input connected to the loop filter output and the output coupled to the second mixer input; and
    a memory configured to store an estimate value of a frequency shift of a carrier frequency of said input signal received at the first mixer input, the estimate value applied to the second input of the adder.

2. The circuit of claim 1, further including a first switch configured to selectively disconnect the first mixer input from receiving the input signal.

3. A phase-lock loop circuit comprising:
    a mixer having first and second inputs and an output, the first input configured to receive an input signal;

a phase detector having an input connected to the mixer output and having an output;
a loop filter having an input connected to the phase detector output and having an output;
an adder having first and second inputs and an output, the first input connected to the loop filter output and the output coupled to the second mixer input;
a memory configured to store an estimate value of a frequency shift of a carrier frequency of the input signal received at the first mixer input, the estimate value applied to the second input of the adder; and
a frequency estimator configured to receive the input signal and generate the estimate value of the frequency shift of the carrier frequency of the input signal which is stored in the memory.

4. The circuit of claim 3, further including a second switch configured to selectively disconnect the frequency estimator from the memory.

5. The circuit of claim 4 further including a controller operable to control the first and second switches such that the first switch disconnects the first mixer input from the input signal while the second switch connects the frequency estimator to the memory.

6. The circuit of claim 5 wherein the controller is further operable to control the first and second switches such that the first switch connects the first mixer input to the input signal while the second switch disconnects the frequency estimator from the memory.

7. The circuit of claim 5 further including:
a tracking device configured to track the estimate value of the frequency shift of the carrier frequency output by the frequency estimator.

8. The circuit of claim 7 further including a third switch configured to selectively disconnect the frequency estimator from the tracking device.

9. The circuit of claim 8 wherein the controller is further operable to control the first, second and third switches such that the first switch connects the first mixer input to the input signal and the third switch connects the frequency estimator to the tracking device while the second switch disconnects the frequency estimator from the memory.

10. The circuit of claim 3 wherein the input signal is modulated with quadrature continuous single-carrier modulation and the frequency estimator generates the estimate value of the frequency shift of the carrier frequency of the input signal by processing samples which belong to a constellation of dots comprising an internal square and which samples are situated only in corners of the square.

11. The circuit of claim 3 wherein the input signal is modulated with quadrature continuous single-carrier modulation and the frequency estimator generates the estimate value of the frequency shift of the carrier frequency of the input signal by processing samples which belong to a constellation of dots comprising an external square and which samples are situated only in corners of the square.

12. The circuit of claim 1 wherein the circuit is fabricated as an integrated circuit.

13. The circuit of claim 1 wherein the circuit is part of a receiver.

14. A phase lock loop circuit, comprising:
a controlled oscillator configured to output an oscillation signal having frequency set as a function of a control signal received at an input of the controlled oscillator;
a mixer having first and second inputs and an output, the first input configured to receive an input signal and the second input receiving the oscillation signal;
a phase detector having an input connected to the mixer output and having an output;
a loop filter having an input connected to the phase detector output and having an output;
an adder having first and second inputs and an output configured to produce the control signal applied to the controlled oscillator input, the first input connected to the loop filter output; and
a memory configured to store an estimate value of a frequency shift of a carrier frequency of said input signal to the mixer, the estimate value applied to the second input of the adder.

15. The circuit of claim 14, further including a first switch configured to selectively disconnect the first mixer input from receiving the input signal.

16. A phase lock loop circuit comprising:
a controlled oscillator configured to output an oscillation signal having frequency set as a function of a control signal received at an input of the controlled oscillator;
a mixer having first and second inputs and an output, the first input configured to receive an input signal and the second input receiving the oscillation signal;
a phase detector having an input connected to the mixer output and having an output;
a loop filter having an input connected to the phase detector output and having an output;
an adder having first and second inputs and an output configured to produce the control signal applied to the controlled oscillator input, the first input connected to the loop filter output;
a memory configured to store an estimate value of a frequency shift of a carrier frequency of said input signal to the mixer, the estimate value applied to the second input of the adder; and
a frequency estimator configured to receive the input signal and generate at its output the estimate value of the frequency shift of the carrier frequency of the input signal for storage in the memory.

17. The circuit of claim 16, further including a second switch configured to selectively disconnect the output of the frequency estimator from the memory.

18. The circuit of claim 17 further including a controller operable to control the first and second switches such that when the first switch is closed the second switch is open, and vice versa.

19. The circuit of claim 16 wherein the input signal is modulated with quadrature continuous single-carrier modulation and the frequency estimator is operable to generate the estimate value of the frequency shift of the carrier frequency of the input signal by processing samples which belong to a constellation of dots comprising an internal square and which samples are situated only in corners of the internal square.

20. The circuit of claim 16 wherein the input signal is modulated with quadrature continuous single-carrier modulation and the frequency estimator is configured to generate the estimate value of the frequency shift of the carrier frequency of the input signal by processing samples which belong to a constellation of dots comprising an external square and which samples are situated only in corners of the external square.

21. The circuit of claim 14 wherein the circuit is fabricated as an integrated circuit.

22. The circuit of claim 14 wherein the circuit is part of a receiver.

* * * * *